United States Patent
Doong et al.

[11] Patent Number: 6,150,235
[45] Date of Patent: Nov. 21, 2000

[54] METHOD OF FORMING SHALLOW TRENCH ISOLATION STRUCTURES

[75] Inventors: Yih-Yuh Doong, Kaohsiung; Sung-Chun Hsieh, Taipei; Tsu-Bin Shen, Chung Ho; Ching-Hsiang Hsu, Hsinchu, all of Taiwan

[73] Assignee: Worldwide Semiconductor Manufacturing Corp., Hsinchu, Taiwan

[21] Appl. No.: 09/490,275

[22] Filed: Jan. 24, 2000

[51] Int. Cl.[7] .................................................. H01L 21/76
[52] U.S. Cl. .......................... 438/424; 438/199; 438/221; 438/302; 438/433
[58] Field of Search ..................................... 438/221, 302, 438/424, 433, 449, 525, 199, 223, 224

[56] References Cited

U.S. PATENT DOCUMENTS

| | | | |
|---|---|---|---|
| 5,401,998 | 3/1995 | Chiu et al. | 257/368 |
| 5,786,262 | 7/1998 | Jang et al. | 438/424 |
| 5,795,801 | 8/1998 | Lee | 438/199 |
| 5,851,900 | 12/1998 | Chu et al. | 438/434 |
| 5,960,276 | 9/1999 | Liaw et al. | |

*Primary Examiner*—Tuan H. Nguyen
*Assistant Examiner*—Jack Chen

[57] ABSTRACT

A method for forming shallow trench isolation (STI) structures on a semiconductor substrate is disclosed. First a semiconductor substrate with a first area and a second area adjacent to the first area is provided. A mask layer is formed on the substrate, and is etched to expose portions of the substrate. A first photoresist is formed to cover the second area for exposing the first area. A first implanting procedure is performed with a titled angle to form first doping areas on the substrate encroaching into portions of the substrate covered by the first photoresist. The first photoresist is removed. A second photoresist is formed on the substrate to cover the first area for exposing the second area. And a second implanting procedure is done with a titled angle to form second doping areas on the substrate encroaching into portions of the substrate covered by the second photoresist. The second photoresist is removed. The substrate is etched to remove the first doping areas and the second doping areas for forming trench structures therein. It is noted that portions of the first doping areas and the second doping areas are residual in upper portions of sidewalls of the trench structures adjacent to the mask layer. Then the shallow trench isolations are formed in the trench structures.

16 Claims, 7 Drawing Sheets

METHOD OF FORMING SHALLOW TRENCH ISOLATION STRUCTURES

FIELD OF THE INVENTION

The present invention relates to a process for manufacturing shallow trench isolator, and more specifically, to a process for manufacturing doping areas in upper portions of sidewalls of shallow trench isolators.

BACKGROUND OF THE INVENTION

With the continuous advancement and development in the semiconductor manufacture to ultra large semiconductor integration (ULSI), the performance of MOS devices can not be promoted effectively due to the scales of these devices are getting smaller. And on the other hand, the process for manufacturing these shrinkage devices are also getting more difficult. Especially when the scales getting under 0.25 μm, some deficiencies unapparent at the original large scale will be magnified, and reduce the yields and reliabilities of the manufactured devices. For example, the edge profile of shallow trench isolation (STI) used to divide the active areas in the semiconductor process will result in leakage currents of the MOS devices formed on the active areas.

Please refer to FIG. 1, a top view of the semiconductor wafer in related process is illustrated. A rectangle structure 10 made of polysilicon is used to serve as a gate structure of a MOS devices. And another rectangle structure 12 is used to serve as the active area (AA) for defining the MOS devices. It is noted that a source and a drain structure is defined in the rectangle structure 12 not covered by the gate structure 10 for a transistor structure. Thus a length L of the gate structure 10 in FIG. 1 is used to define the channel length of the manufactured transistor device. And the width W of the rectangle area 12 can be used to define the width of the transistor device.

Then, referring to FIG. 2, the cross section view of the semiconductor wafer along the line B—B' of the FIG. 1 is shown. The full view of the transistor structure is apparently illustrated, wherein the gate structure 10 is located on the semiconductor substrate 14. The source region 16 and the drain region 17 are defined in the semiconductor substrate 14 adjacent to the gate structure 10. The distance between the source region 16, through the gate structure 10, to the drain region 17 is equal to the length 12L of the active area 12 in FIG. 1.

Referring to FIG. 3, the cross section view of the semiconductor wafer along the line A—A' of the FIG. 1 is illustrated. As described above, the gate structure 14 is on the top surface of the semiconductor substrate 14. And two shallow trench isolations are formed in the semiconductor substrate 14 to define the active area for manufacturing the transistor device, wherein the width 12W between the two isolations is equal to the width W of the active area 12 shown is FIG. 1. In general, the MOS device is defined with the gate structure 10 in the active area 12 and substrate 14, so the shallow trench isolations 18, the substrate 14 therein, and the gate structure 10 all can influence the performance of the MOS device.

Notedly, following the shrinkage scales of the semiconductor devices, the ratio (W/L) of the width W of the active area to the length L of the transistor channel is getting to 2:1 now from the value 10:1 of conventional technique. Namely the active area used to contain a MOS device is also getting smaller due to the scale shrinkage of devices, and reduces the ratio of W/L. However, following the lower ratio of W/L, the profiles of the junctions between the substrate 14 and the shallow trench isolations 18 will cause enormous influence to the manufactured transistor devices. For example, the corner profile in the junction area 20 of the substrate 14 will result in the electrical field thereof more crowded and bring about the tip discharge effect. On the other hand, the parasitic corner transistors will be formed in the junction area 20 at the edges of the active area 12, thus the current leakage and sub-threshold leakage will occur therein.

The proposal of forming doping areas in the sidewalls and the bottoms of trench structures is provided to overcome the issue above in by Liaw in U.S. Pat. No. 5,960,276. As shown in FIG. 4, a thin oxide layer 21 is formed on the top surface of the trench structure defined on a semiconductor substrate 14. Then an ion-implanting procedure is performed to form the doping areas in sidewalls and bottom of the trench. For the portions of sidewalls and bottom located in the P-well, the doping area 22 is with P-type dopants. Similarly the doping area 24 with N-type dopants is defined in the portions of sidewall and bottom located in the N-well of the substrate 14. Thus, the crowded electrical field on the junction between the active area and the trench isolation structure can be reduced, and the probability of sub-threshold leakage occurring can be lowered.

However, when the doping area, as described above, is defined in sidewalls and bottom of the trench structure, the P-type doping area 22 and the N-type doping area 24 contact with each other in the junction between the N-well and the P-well as shown in FIG. 4. Thus, the depletion region between the N-well and the P-well will be lowered to cause the leakage occurring on the junction between the N-well and the P-well.

SUMMARY OF THE INVENTION

The prime objective of the present invention is to provide a method for forming shallow trench isolations which can reduce the leakage current occurring on the edges of the active area of MOS transistor devices.

The another objective of the present invention is to provide a method for controlling the threshold voltage of the parasitic corner transistors of active areas.

The further objective of the present invention is to provide a method of manufacturing the shallow trench isolations to adjust the leakage current occurring on the edges of the active areas.

A method for forming shallow trench isolation (STI) structures on a semiconductor substrate is disclosed in the present invention. First a substrate with a PMOS area and a NMOS area adjacent to the PMOS area is provided, wherein the PMOS area is where PMOS devices will be built and the NMOS area is where NMOS devices will be built. Then a nitride layer is deposited on the substrate to cover the PMOS area and the NMOS area. And an oxide layer is formed on the nitride layer. Next the oxide layer and the nitride layer are etched to form openings therein to expose portions of the substrate in the PMOS area and the NMOS area. A first photoresist is formed on the substrate and the oxide layer to cover the NMOS area for exposing the PMOS area. A first ion-implanting procedure is performed with a tilted angle to form N-type doping areas in the PMOS areas on the substrate by using the first photoresist as a mask, wherein the N-type doping areas encroach into portions of the substrate covered by the first photoresist. Then the first photoresist is removed. A second photoresist is formed on the substrate and the oxide layer to cover the PMOS area for exposing the NMOS area. A second ion-implanting procedure is performed with a titled angle to form P-type doping areas in the NMOS area on the substrate by using the second photoresist as a mask. The P-type doping areas encroach into portions of the substrate covered by the second photoresist. The second photoresist is next removed. The substrate is etched by using the oxide layer as an etching mask to remove the N-type doping areas and the P-type doping areas to form trench structures in the PMOS area and the NMOS area of the substrate, wherein the residual N-type doping areas are reserved in upper portions of sidewalls of the trench structures in the PMOS area. And the residual P-type doping areas are reserved in upper portions of sidewalls of the trench structures in the NMOS area. The shallow trench isolations are formed into the trench structures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel method for forming shallow trench isolation (STI) structures. An ion-implanting procedure with a titled angle is performed to define doping areas on a substrate before etching the substrate to form trench structures therein. Thus, after etching the substrate, residual doping areas are still reserved in the upper portions of the sidewalls of trench structures and can be used to restrain the sub-threshold leakage on the junctions between shallow trench isolations and active areas defined in latter steps. The detailed description of the present invention is as follows.

Figure 1:
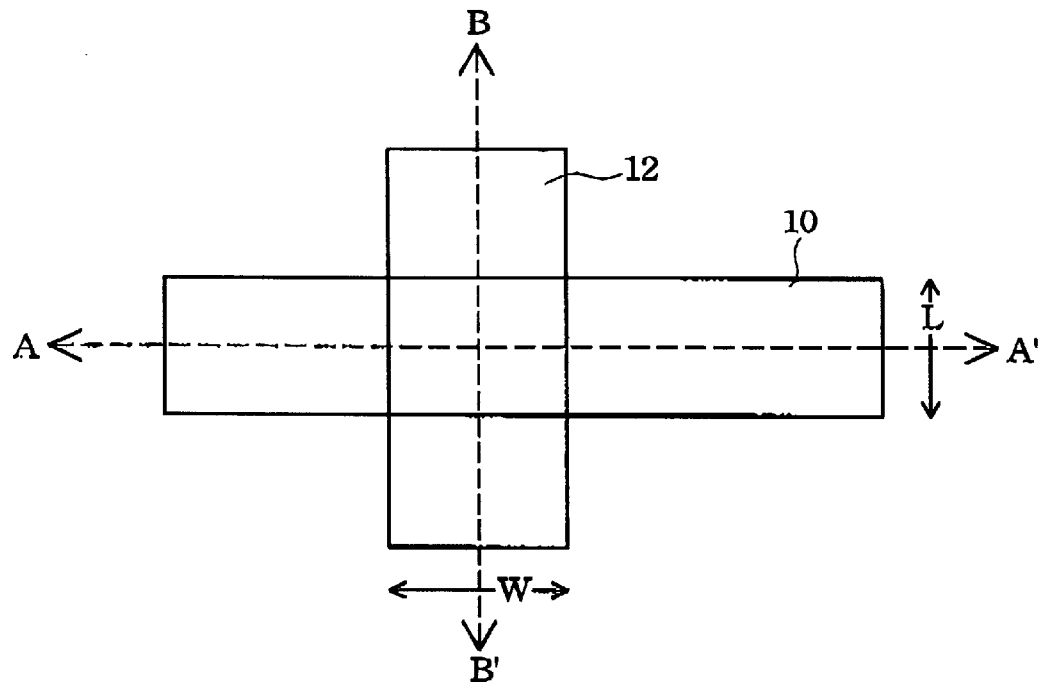
FIG. 1 is a top plane view of a semiconductor wafer illustrating the gate structure and the active area defined on the top surface of the substrate.
Figure 2:
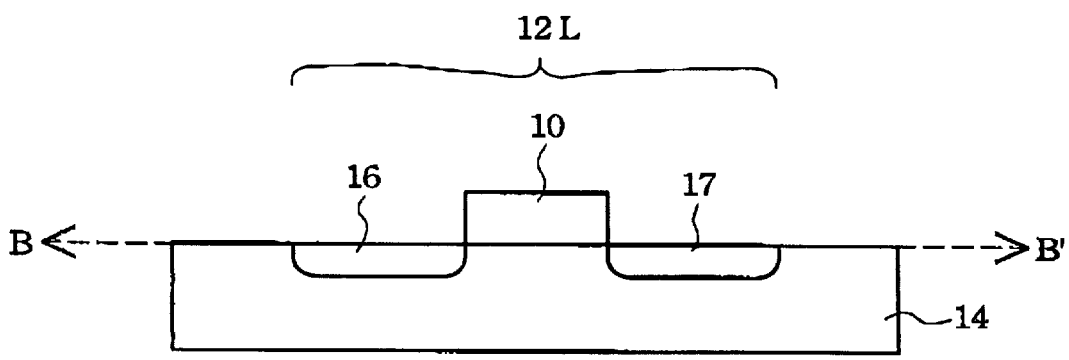
FIG. 2 is a cross-sectional view of a semiconductor wafer illustrating the MOS transistor device defined according to the prior art.
Figure 3:
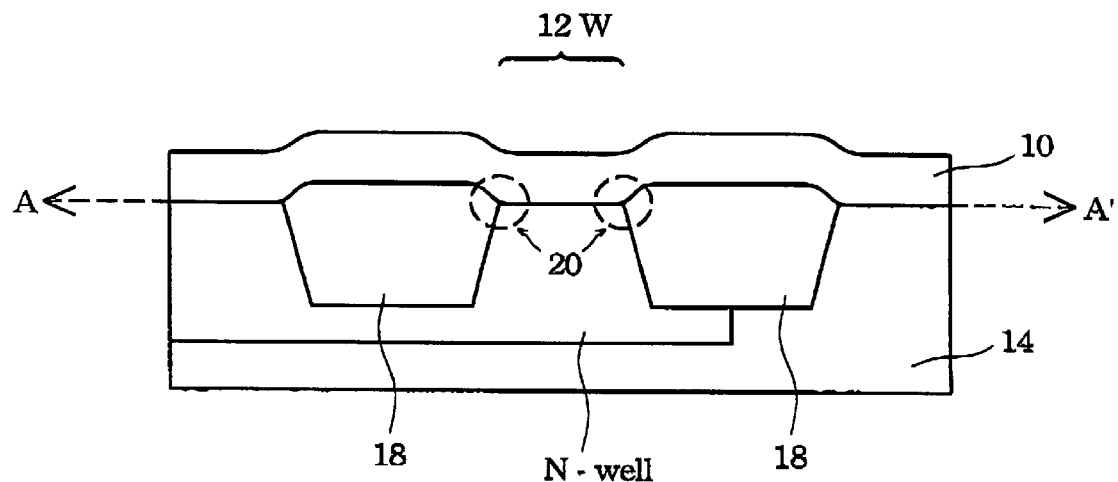
FIG. 3 is a cross-sectional view of a semiconductor wafer illustrating the step of forming STI to define the active area for containing MOS transistor device according to the prior art.
Figure 4:
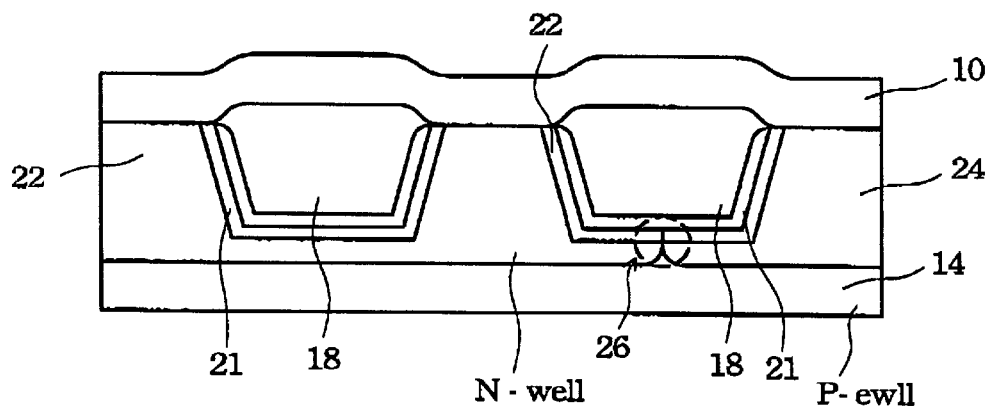
FIG. 4 is a cross-sectional view of a semiconductor wafer illustrating the step of forming doping areas in the bottom of STI to lower sub-threshold leakage according to the prior art.
Figure 5:
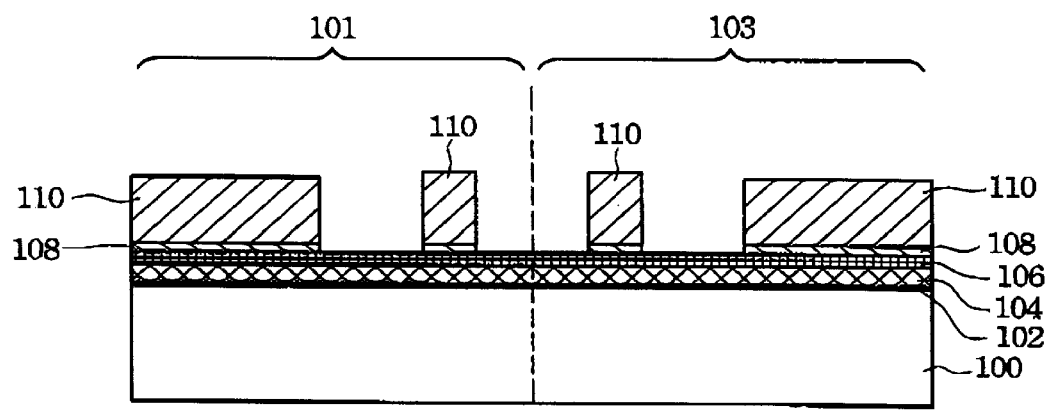
FIG. 5 is a cross-sectional view of a semiconductor wafer illustrating the step of forming the oxide layer, the nitride layer, the ARC layer and the photoresist on the semiconductor substrate according to the present invention.

Please refer to FIG. 5, in the preferred embodiment, a silicon substrate 100 is provided with <100> crystallographic orientation. In general, various semiconducting materials, such as gallium arsenide, germanium or silicon on insulator (SOI) can be chosen to serve as the substrate 100. Besides, any other suitable orientation such as <110> or <111> is useful due to the surface property is not critical in the present invention. It is noted that the substrate 100 has a PMOS area 101 and a NMOS area 103, wherein the NMOS area 103 is adjacent to the PMOS area 101. And the PMOS area 101 is where PMOS devices will be built and similarly the NMOS area 103 is where NMOS devices will be built.

Then a first oxide layer 102, a nitride layer 104, a second oxide layer 106 and an anti-reflected coating (ARC) layer 108 are formed on the substrate 100 in sequence. The first oxide layer 102 with a preferred thickness about 100 to 200 angstroms to prevent top surfaces of the substrate 100 being damaged by the nitride layer 104. In a preferred embodiment, the first oxide layer 102 is formed on the substrate 100 by using an oxygen-steam ambient, at a temperature between about 700 to 1100 degrees centigrade. Alternatively, the first oxide layer 102 may be formed using other known oxide chemical compositions and procedures.

The nitride layer 104 and the second oxide layer 106 are used to serve as masks in latter photolithography process and ion-implanting procedures. In a preferred embodiment, the nitride layer 104 is deposited at a temperature of about 400 to 450° C. by using reactive gases comprise of $SiH_4$, $N_2O$ and $NH_3$. And the second oxide layer 106 can be formed by using chemical vapor deposition (CVD) process, using TEOS as a source at a temperature between about 600 to 800° C., at a pressure 0.1 to 10 torrs. The thickness of the nitride layer 104 is about 1100 to 1900 angstroms, and preferably about 1500 angstroms. The second oxide layer 106 is about 800 to 1600 angstroms, and preferably about 1200 angstroms.

In addition, The ARC layer 108 is made of silicon nitride layer and can be deposited by any suitable process. As known by a person of ordinary skills in the art, the silicon nitride layer can be formed using Low Pressure Chemical Vapor Deposition (LPCVD), Plasma Enhance Chemical Vapor Deposition (PECVD), and so. Further, the temperature forming the silicon nitride layer is at a range of 400–800° C. In the preferred embodiment, the reaction gases of the step to form silicon nitride layer are $SiH_4$, $NH_3$, $N_2$, $N_2O$ or $SiH_2Cl_2$, $NH_3$, $N_2$, $N_2O$.

Figure 6:
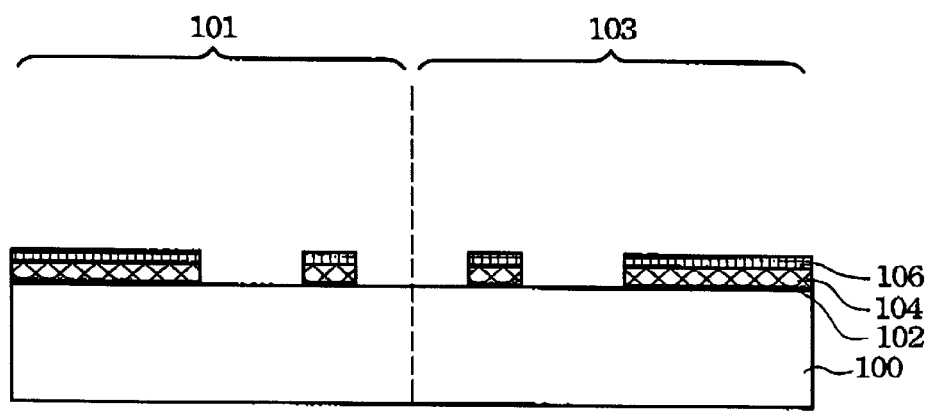
FIG. 6 is a cross-sectional view of a semiconductor wafer illustrating the step of etching the nitride layer and the oxide layer to expose a portion of the semiconductor substrate according to the present invention.

Next, a photoresist 110 is formed onto the top surface of ARC layer 108. The photoresist 110, as shown in FIG. 5, has three openings defined thereon. Then, the photoresist 110 is used to serve as an etching mask for etching the ARC layer 108 to transfer the opening patterns onto the ARC layer 108. Sequently, as shown in FIG. 6, the second oxide layer 106, nitride layer 104 and the first oxide layer 102 are etched to define the opening patterns onto these layers for exposing portions of the substrate 100 in the PMOS area 101 and in the NMOS area 103. Besides, after the etching procedure, the photoresist 110 is removed. In a preferred embodiment, an anisotropically etching procedure, such as reactive ion etching (RIE) method, is performed to etch the nitride layer and the oxide layer. The etchant used to etch the nitride layer can be chosen from the group of $CH_3CHF_2$, $CHF_3$ and $CF_4/H_2$; and the etchant used to etch the oxide layer can be chosen from the group of $CCl_2F_2$, $CHF_3/CF_4$, $CHF_3/O_2$, $CH_3CHF_2$ and $CF_4/O_2$.

Figure 7:
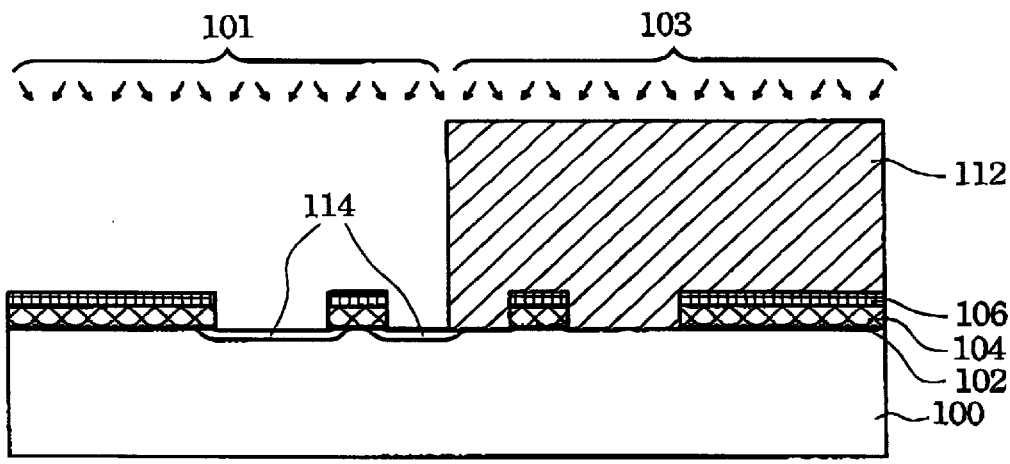
FIG. 7 is a cross-sectional view of a semiconductor wafer illustrating the step of performing the ion-implanting procedure to form the doping areas on the semiconductor substrate according to the present invention.

Then, referring to FIG. 7, a first photoresist 112 is formed onto the substrate 100 to cover the NMOS area 103. Next an ion-implanting procedure is performed to form N-type doping areas 114 on the exposed substrate 100 in the PMOS area 101 by using the first photoresist 112 and the second oxide layer 106 as the masks. It is noted that the ion-implanting procedure is with a tilted angle to let the N-type doping areas 114 encroach into the substrate 100 underneath the first oxide layer 102. In a preferred embodiment, the N-type doping areas 114 are formed with dopant such as phosphorus or arsenic. And the first photoresist 112 is removed after performing the ion-implanting step.

Figure 8:
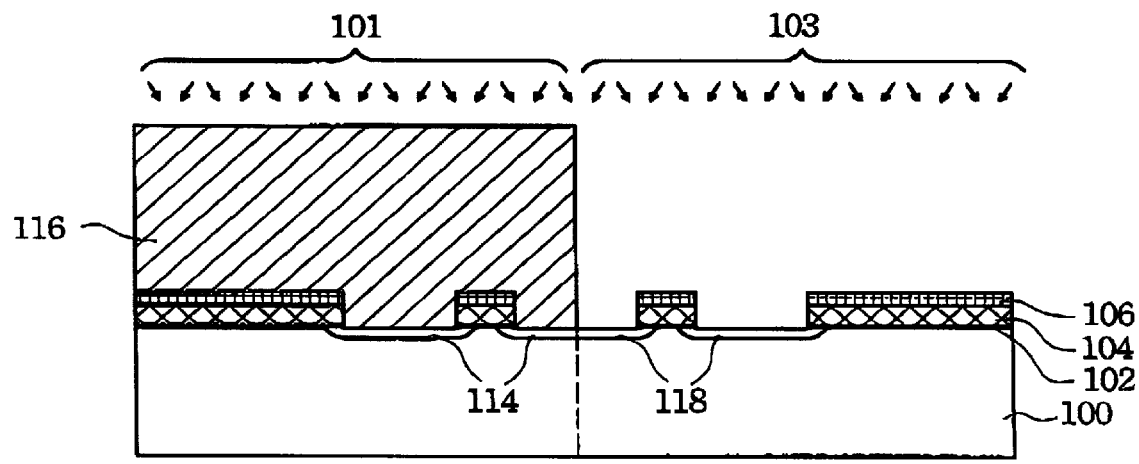
FIG. 8 is a cross-sectional view of a semiconductor wafer illustrating the step of performing the ion-implanting procedure to form the doping areas on the semiconductor substrate according to the present invention.

Again, referring to FIG. 8, a second photoresist 116 is formed onto the substrate 100 to cover the PMOS area 101. Next another ion-implanting procedure is performed to form P-type doping areas 118 on the exposed substrate 100 in the NMOS area 103 by using the second photoresist 112 and the second oxide layer 106 as the masks. This ion-implanting procedure is also with a tilted angle to let the P-type doping areas 118 encroach into the substrate 100 underneath the first oxide layer 102 along the edges of the nitride layer 104. The P-type doping areas 118 are formed with dopant such as boron or $BF_2$. The second photoresist 116 is removed after performing this ion-implanting step.

Figure 9:
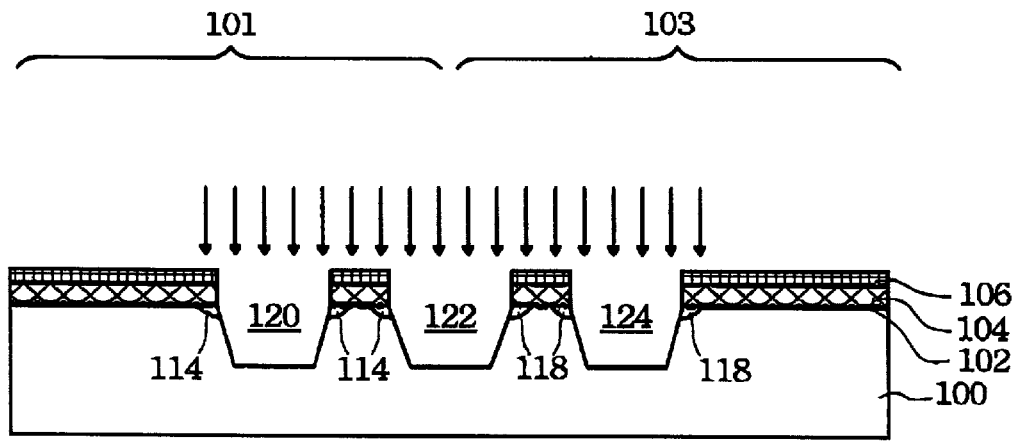
FIG. 9 is a cross-sectional view of a semiconductor wafer illustrating the step of etching the substrate to form trench structures in the semiconductor substrate according to the present invention.

Referring to FIG. 9, after defining the N-type doping areas 114 and P-type doping areas 118 by using the first photoresist 112 and the second photoresist 116 individually, an etching procedure is performed to etch the substrate 100 to form trench structures 120, 122, 124 in the PMOS area 101 and the NMOS area 103 of the substrate 100 by using the second oxide layer 106 and nitride layer 104 as etching masks. In a preferred embodiment, this etching procedure is anisotropically etching step such as reactive ion etching (RIE) method. And when the substrate 100 is made of silicon material, the etchant used in this etching step can chosen from the group of $SiCl_4/Cl_2$, $BCl_3/Cl_2$, $HBr/Cl_2/O_2$, $HBr/O_2$, $Br_2/SF_6$ and $SF_6$.

It is noted there are still residual N-type doping areas 114 reserved in the upper sidewalls of the trench structure 120 underneath the first oxide layer 102 in the PMOS area 101. And similarly still residual portions of the P-type doping areas 118 are reserved in the upper sidewall of the trench structure 124 underneath the first oxide layer 102 in the NMOS area 103. As to the trench structure 122 located in the junction between the PMOS area 101 and the NMOS area 103, as shown in FIG. 9, the upper portion of the left sidewall of the trench structure 122 located in the PMOS area 101 has residual N-type doping area 114. And the upper portion of the right sidewall of the trench structure 122 located in the NMOS area 103 also has residual P-type doping area 118.

Figure 10:
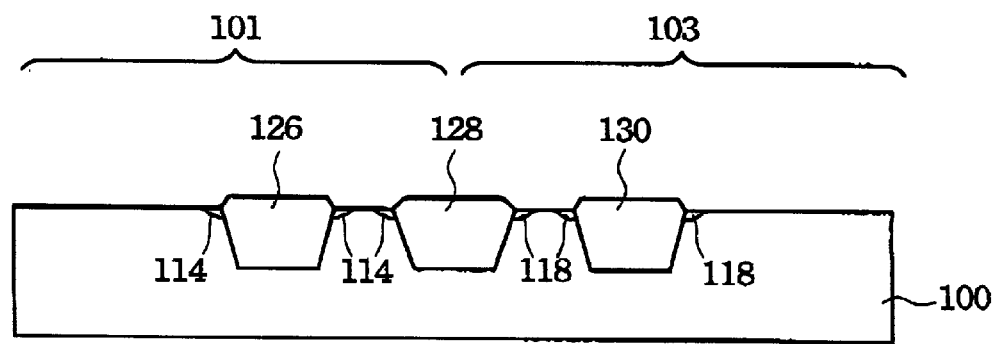
FIG. 10 is a cross-sectional view of a semiconductor wafer illustrating the step of forming the STI structures in the semiconductor substrate according to the present invention.

Please refer to FIG. 10, after defining the trench structure 120, 122, 124 in the substrate 100, the second oxide layer 106, the nitride layer 104 and the first oxide layer 102 are removed. Then, the shallow trench isolations (STI) 126, 128, 130 are formed into the trench structures 120, 122, 124. In general, hot phosphoric acid solution can be used to remove the residual oxide layer 104, while the HF solution is used to remove the first oxide layer 102 and the second oxide layer 106. And the shallow trench isolations can be manufactured by first using the thermal oxidation or chemically vapor deposition (CVD) method to deposit oxide layer and subquently performing the chemical mechanical polishing (CMP) procedure for removing a portion of the oxide layer and planization.

Figure 11:
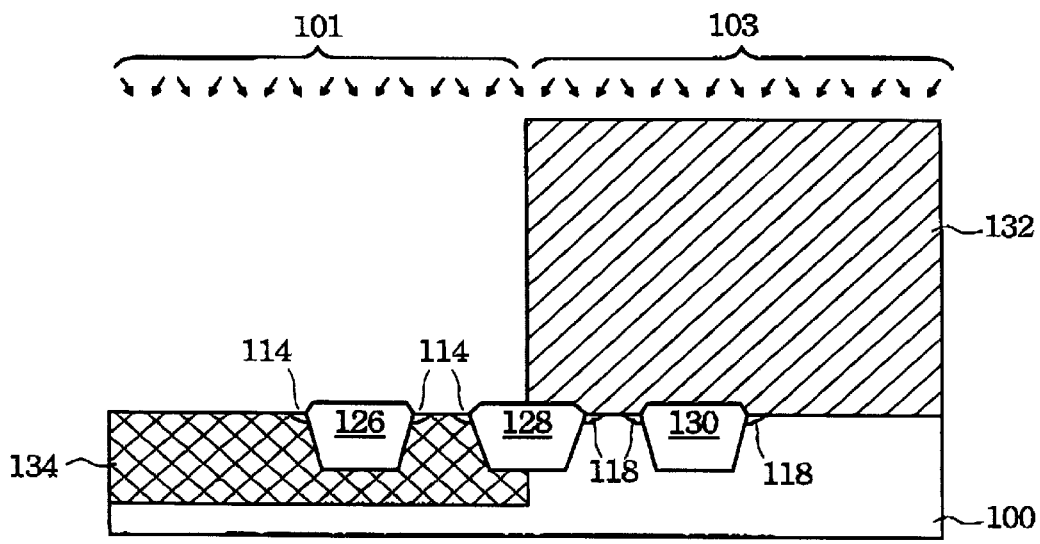
FIG. 11 is a cross-sectional view of a semiconductor wafer illustrating the step of performing the ion-implanting procedure to form the P-type well in the substrate according to the present invention.
Figure 12:
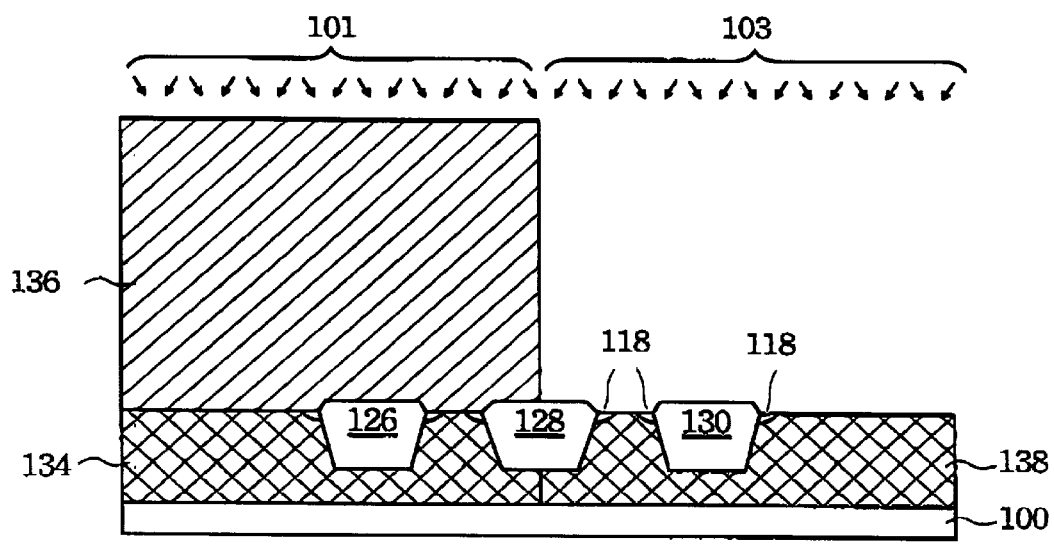
FIG. 12 is a cross-sectional view of a semiconductor wafer illustrating the step of performing the ion-implanting procedure to form the N-type well in the substrate according to the present invention.

Next, as shown in FIG. 11, a third photoresist 132 is formed on the substrate 100 to cover the NMOS area 103. And an ion-implanting procedure with a titled angle is performed to define the N-well 134 into the substrate 100 in the PMOS area 101. The third photoresist 132 is removed after the ion-implanting procedure is done. And as shown in FIG. 12, a fourth photoresist 136 is formed to cover the PMOS area 101 of the substrate 100. Then another ion-implanting procedure is done with a tilted angle to form the P-well 138 in the substrate 100 in the NMOS area 103. The fourth photoresist 136 is also removed after forming the P-well 138.

Figure 13:
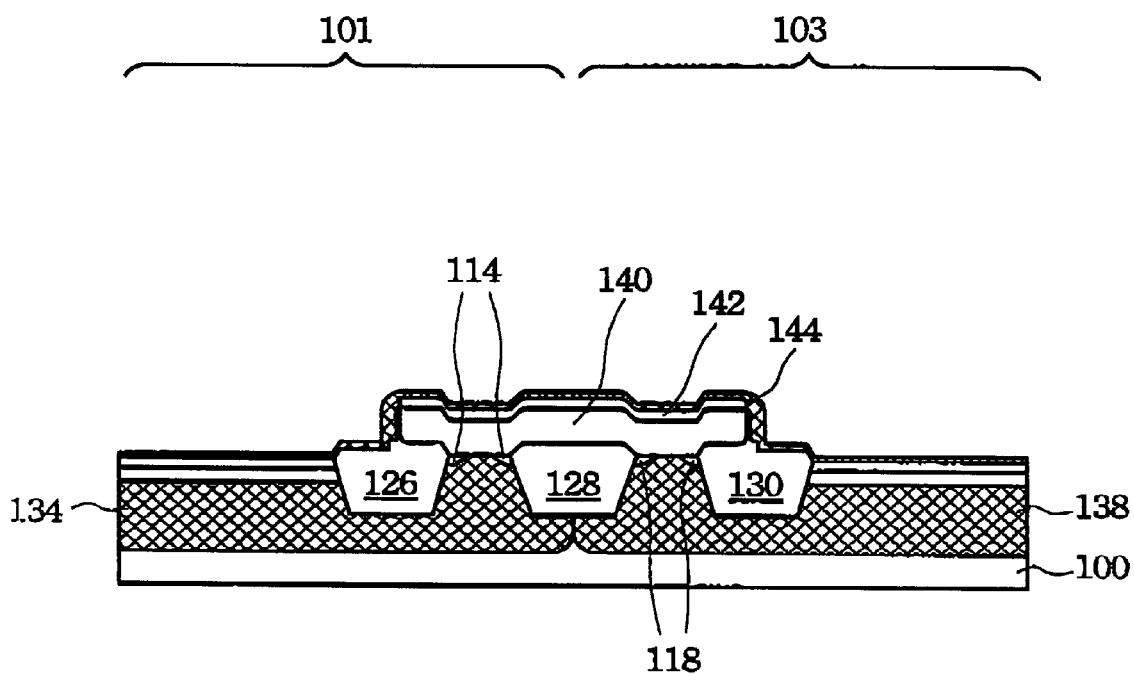
FIG. 13 is a cross-sectional view of a semiconductor wafer illustrating the step of forming the polysilicon layer, the silicide layer on the semiconductor substrate to define MOS transistor devices according to the present invention.

Next, as shown in FIG. 13, the polysilicon layer 140 and the metal silicide layer 142 are formed on the shallow trench isolations 126, 128, 130 and the substrate 100 used for active area by using the conventional technique to define the gate structures of MOS transistor devices. And the nitride layer 144 is formed on the substrate 100, the polysilicon layer 140 and metal silicide layer 142 to serve as a barrier layer. For the active area located in the PMOS area 101 between the shallow trench isolations 126 and 128, required PMOS devices can be built therein. And for the active area located in the NMOS area 103 between the shallow trench isolations 128 and 130, NMOS devices can be built therein.

It is noted that the electrical field crowded on the edges of the active areas can be reduced and the leakage current occurring thereon can be also restrained due to the residual N-type doping areas 114 are reserved in the upper sidewalls of the substrate adjacent to the edges of active areas for PMOS transistor devices. Namely for the parasitic corner transistors generated on the edges of the active areas, the effective threshold voltage will be higher than that of the prime transistor located on the center portion of the active areas due to the residual N-type doping areas 114. Thus, the sub-threshold leakage cause by the parasitic corner transistors adjacent to the shallow trench isolations can be restrained effectively. Further, as shown in FIG. 13, because there is not residual higher N-type doping areas 114, nor the residual higher P-type doping areas 118 reserved on the junction between the PMOS area 101 and the NMOS area 103, the depletion region of P-N junction will not alter and the probability of leakage current occurring will be lowered effectively.

Notedly, the N-type doping areas 114 are formed in the PMOS area 101 (N-well) adjacent to the active area for reducing the leakage current occurring on the edges of the active areas, and the P-type doping areas 118 are formed in the NMOS area 103 (P-well) to reduce the leakage current too. However, for some required devices, the N-type doping areas can be formed in the NMOS area (P-well) by adjusting the doping concentration to control the threshold voltages of the parasitic corner transistors and to control the leakage current therein. And equally the P-type doping areas can be formed in the PMOS area (N-well) to increase the leakage current to a required value.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming shallow trench isolation (STI) structures on a semiconductor substrate, said method comprises:

providing a semiconductor substrate, wherein said substrate has a first area and a second area adjacent to said first area;

forming a mask layer on said substrate;

etching said mask layer to expose portions of top surface of said substrate in said first area and in said second area;

forming a first photoresist on said substrate to cover said second area for exposing said first area;

performing a first ion-implanting procedure with a tilted angle to form first doping areas on said substrate by using said first photoresist as a mask, wherein said first doping areas encroach into portions of said substrate covered by said first photoresist;

removing said first photoresist;

forming a second photoresist on said substrate to cover said first area for exposing said second area;

performing a second ion-implanting procedure with a tilted angle to form second doping areas on said substrate by using said second photoresist as a mask, wherein said second doping areas encroach into portions of said substrate covered by said second photoresist;

removing said second photoresist;

etching said substrate by using said mask layer as an etching mask to remove said first doping areas and said second doping areas to form trench structures in said substrate, wherein portions of said first doping areas and said second doping areas are residual in upper portions of sidewalls of said trench structures adjacent to said mask layer; and forming shallow trench isolations in said trench structures.

2. The method according to claim 1, wherein said first area is used to define a PMOS area for containing PMOS devices, and said second area is used to define a NMOS area for containing NMOS devices.

3. The method according to claim 2, wherein said first doping areas are N-type doping areas, and said second doping areas are P-type doping areas.

4. The method according to claim 3, wherein said N-type doping areas are doped with dopants chosen from a group of phosphorus and arsenic, and said P-type doping areas are doped with dopants chosen from a group of boron and $BF_2$.

5. The method according to claim 2, wherein said first doping areas are P-type doping areas, and said second doping areas are N-type doping areas.

6. The method according to claim 5, wherein said N-type doping areas are doped with dopants chosen from a group of phosphorus and arsenic, and said P-type doping areas are doped with dopants chosen from a group of boron and $BF_2$.

7. The method according to claim 1, wherein said mask layer is made of a composition layer comprises an oxide layer and a nitride layer.

8. The method according to claim 1, wherein said step of etching said substrate is performed by using an anisotropically etching procedure.

9. The method according to claim 1, wherein said first area of said substrate contains a N-well area and said second area of said substrate contains a P-well area.

10. The method according to claim 9, wherein said first doping areas are N-type doping areas with dopants chosen from a group of phosphorus and arsenic, and said second doping areas are P-type doping areas with dopants chosen from a group of boron and $BF_2$.

11. The method according to claim 9, wherein said first doping areas are P-type doping areas with dopants chosen from a group of boron and $BF_2$, and said second doping areas are N-type doping areas with dopants chosen from a group of phosphorus and arsenic.

12. A method for forming shallow trench isolation (STI) structures on a semiconductor substrate, said method comprises:

providing a substrate, wherein said substrate has a PMOS area and a NMOS area adjacent to said PMOS area, wherein said PMOS area is where PMOS devices will be built and said NMOS area is where NMOS devices will be built;

forming a nitride layer on said substrate to cover said PMOS area and said NMOS area;

form a oxide layer on said nitride layer;

etching said oxide layer and said nitride layer to form openings in said oxide layer and said nitride layer to expose portions of said substrate in said PMOS area and said NMOS area;

forming a first photoresist on said substrate and said oxide layer to cover said NMOS area for exposing said PMOS area;

performing a first ion-implanting procedure with a tilted angle to form N-type doping areas in said PMOS areas on said substrate by using said first photoresist as a mask, wherein said N-type doping areas encroach into portions of said substrate covered by said first photoresist;

removing said first photoresist;

forming a second photoresist on said substrate and said oxide layer to cover said PMOS area for exposing said NMOS area;

performing a second ion-implanting procedure with a tilted angle to form P-type doping areas in said NMOS area on said substrate by using said second photoresist as a mask, wherein said P-type doping areas encroach into portions of said substrate covered by said second photoresist;

removing said second photoresist;

etching said substrate by using said oxide layer as an etching mask to remove said N-type doping areas and said P-type doping areas to form trench structures in said PMOS area and said NMOS area of said substrate, wherein residual N-type doping areas are reserved in upper portions of sidewalls of said trench structures in said PMOS area, and residual P-type doping areas are reserved in upper portions of sidewalls of said trench structures in said NMOS area; and forming shallow trench isolations in said trench structures.

13. The method according to claim 12, wherein a first oxide layer is formed on outer surface of said substrate before said nitride layer is formed for preventing said nitride layer damaging said outer surface of said substrate.

14. The method according to claim 12, after forming said oxide layer, further comprises following steps of:

forming a anti-reflected coating (ARC) layer on said oxide layer to promote resolutions of photolithography; and forming a photoresist on said ARC layer, wherein said photoresist has openings using to define trench patterns onto said substrate.

15. The method according to claim 12, wherein said N-type doping areas are doped with dopants chosen from a group of phosphorus and arsenic.

16. The method according to claim 12, wherein said P-type doping areas are doped with dopants chosen from a group of boron and $BF_2$.

\* \* \* \* \*